(12) United States Patent
Iwamoto

(10) Patent No.: US 6,656,275 B2
(45) Date of Patent: Dec. 2, 2003

(54) PARTIAL PLATING SYSTEM

(75) Inventor: Shigeki Iwamoto, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 37 days.

(21) Appl. No.: 09/841,224

(22) Filed: Apr. 24, 2001

(65) Prior Publication Data

US 2001/0036514 A1 Nov. 1, 2001

(30) Foreign Application Priority Data

Apr. 27, 2000 (JP) ........................................ 2000-128375

(51) Int. Cl.$^7$ ............................................... B05B 15/04
(52) U.S. Cl. ........................ 118/301; 118/305; 118/505; 438/942
(58) Field of Search ......................... 438/942; 118/301, 118/505, 325, 305; 204/224 R

(56) References Cited

U.S. PATENT DOCUMENTS

| | | | |
|---|---|---|---|
| 3,860,499 A | | 1/1975 | Graham et al. |
| 3,888,745 A | * | 6/1975 | Hojyo .......................... 101/129 |
| 3,974,056 A | | 8/1976 | Jogwick |
| 4,163,704 A | | 8/1979 | Murata |
| 4,367,125 A | * | 1/1983 | Avellone ..................... 204/206 |
| 6,129,039 A | * | 10/2000 | Evers ........................... 118/301 |

FOREIGN PATENT DOCUMENTS

| | | | |
|---|---|---|---|
| JP | A-60-255992 | 12/1985 | |
| JP | A-60-260142 | 12/1985 | |
| JP | A-61-177391 | 8/1986 | |
| JP | 62156290 | * 7/1987 | |
| JP | A-63-247392 | 10/1988 | |
| JP | A-7-54190 | 2/1995 | |
| JP | 09316685 | * 12/1997 | ............ C25D/5/02 |

OTHER PUBLICATIONS

English translation of Tani et al., "Mask Device for Spot Plating", Jul. 11, 1987.*
JPO & JAPIO English language abstract of JP 362156290.*
XP-002214499, Derwent Publications, Database WPI, Sep. 21, 1999, 3 pages.
JP 05 125583 A, Patent Abstracts of Japan, May 21, 1993, vol. 17 No. 492. 1 page.
JP 09316685, Patent Abstracts of Japan, vol. 1998. No. 04, Dec. 9, 1997. Abstract, (5 pages).
JP 02107796, Patent Abstracts of Japan, vol. 14 No. 314, Apr. 19, 1990. Abstract, 1 page.

* cited by examiner

*Primary Examiner*—Richard Crispino
*Assistant Examiner*—Michelle A Lazor
(74) *Attorney, Agent, or Firm*—Paul & Paul

(57) ABSTRACT

A partial plating system able to gold plate only inner leads of a TAB frame, provided with a mask having an opening formed to correspond to a plating region of a TAB frame and provided horizontally; an elevating means for lowering the TAB frames toward the mask; and a pressing means for pressing the TAB frame on to the mask; a plating solution being sprayed from below the openings toward the openings to plate the plating region.

5 Claims, 12 Drawing Sheets

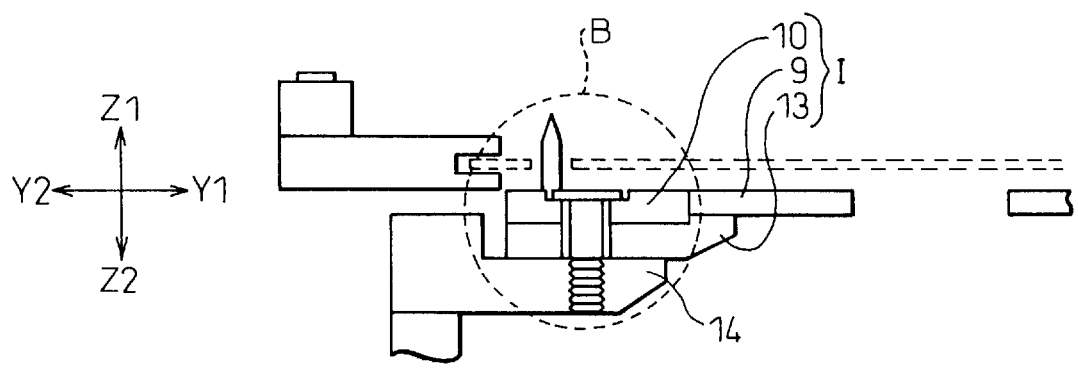
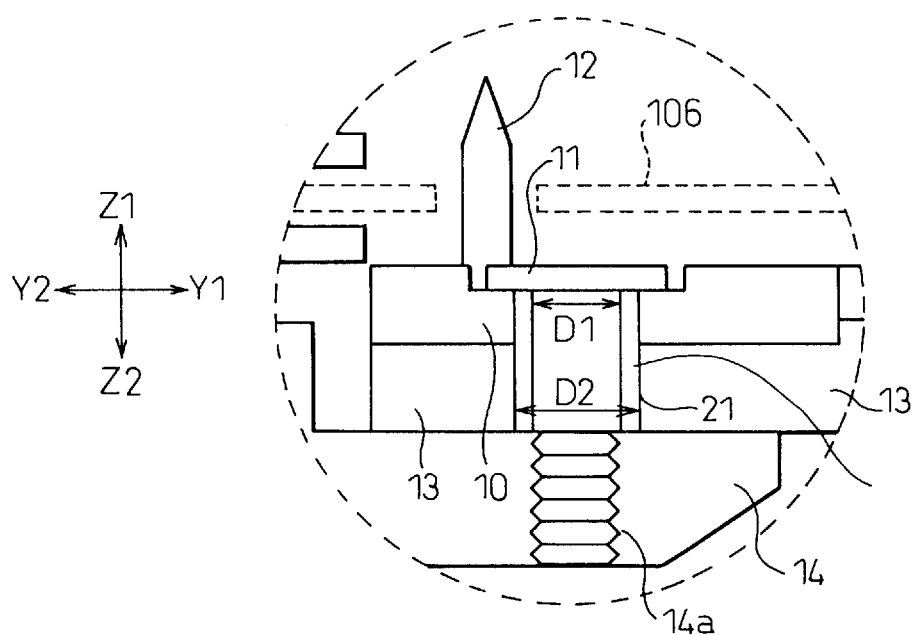

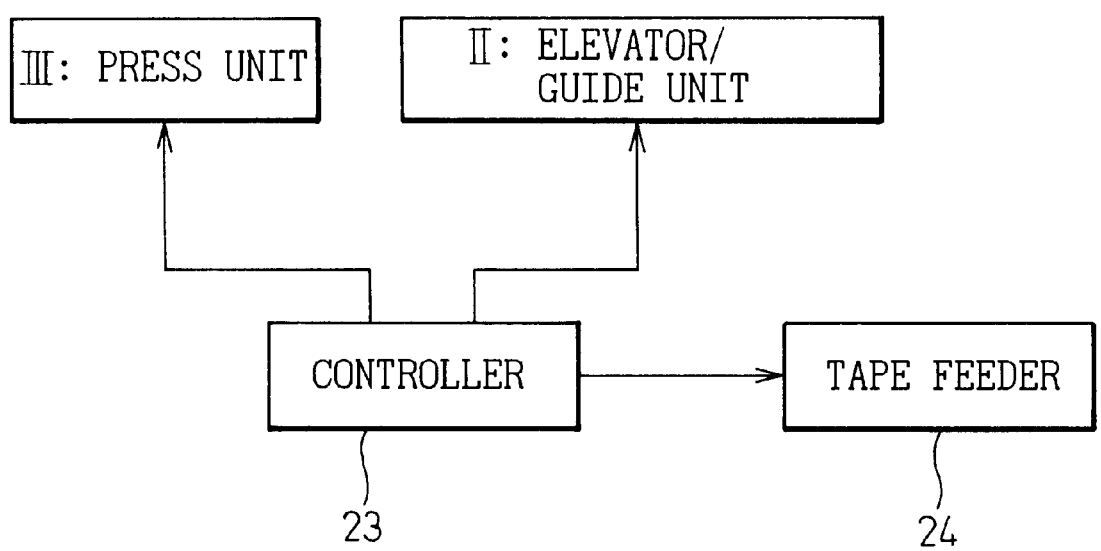

PRIOR ART

PARTIAL PLATING SYSTEM

BACKGROUND OF THE INVENTION

1. Field of the Invention

The present invention relates to a partial plating system, more particularly relates to a technique useful for partial plating of a TAB tape and a lead frame.

2. Description of the Related Art

In recent years, along with the increasing compactness demanded for electronic apparatuses, the semiconductor packages for mounting in the electronic apparatuses have been made smaller in size. One type of such compacter semiconductor package is the tape carrier package (TCP). A TCP consists of a polyimide film or other support on which copper foil leads are formed. The copper foil leads and the terminals of the semiconductor devices are bonded together, then the entire assembly is sealed by a resin.

FIG. 13A is a plan view of part of a polyimide film on which such copper foil leads are formed. As shown in FIG. 13A, a plurality of copper foil leads 102, 102 . . . are formed on the polyimide film 101. Below, the polyimide film 101 on which the plurality of copper foil leads 102, 102 . . . are formed will be referred to as a tape automated bonding (TAB) tape 106. FIG. 133 is an enlarged view of such a copper foil lead. As shown here, the copper foil lead 102 is comprised of an inner lead 102a, an outer lead 102b, a test pad 102c, and parts connecting the same.

Among these, the inner lead 102a projects out toward the inside of a device hole 104 formed in the polyimide film 101. On the other hand, the outer lead 102b is formed at a position corresponding to a window hole 105 formed in the polyimide film 101.

The TAB tape 106 formed in this way is connected with an LSI or other semiconductor device (not shown) by inner lead bonding. In this inner lead bonding, the bumps (not shown) of the semiconductor device and the inner leads 102a are hot pressed together for electrical connection of the bumps and inner leads 102a. After mounting the semiconductor device in this way, the semiconductor device and the polyimide film 101 at the portion inside from the window holes 105 are sealed by a resin.

When the bumps of the semiconductor device are made of gold, however, it is preferable that the portions of the inner leads 102a to be hot pressed with the gold bumps be gold plated. This is because if they are gold plated, the gold plating and the gold contained in the gold bumps fuse with each other and improve the reliability of connection of the inner leads 102a and the gold bumps. Therefore, the general practice has been to gold plate the copper foil leads 102 after forming the copper foil leads 102 on the polyimide film 101.

Next, an explanation will be given, with reference to FIG. 15, of a plating system of the related art used in such a plating process.

FIG. 15 is a perspective view of an entire plating system according to the related art. The plating system 107 of the related art is comprised of a sparger tank 108, a nozzle 109 provided inside the same, and an anodic plate 110. The TAB tape 106 is transported toward the transport direction shown by the arrow in the figure by driving of a roller (not shown) engaged with sprocket holes 103, 103 . . . (see FIG. 13A) formed in the polyimide film 101. The TAB tape 106 is transported in a state held with its surface in the vertical plane (called "vertical transport" hereinafter). Note that the sparger tank 108 is formed with slits 108a, 108a at the portion where the TAB tape 106 is fed in and the portion where it is fed out.

When a TAB tape 106 is transported to the plating system 107, a plating solution is sprayed from the nozzle 109 to fill the inside of the sparger tank 108 with the plating solution. If current is sent to the copper foil leads 102 and the anodic plate 110 in this state using the copper foil leads 102 of the TAB tape 106 as cathodes, the copper foil leads 102 will be gold plated.

As explained above, however, the portions which require the gold plating in the copper foil leads 102 are the inner leads 102a. The rest of the portions do not require gold plating. According to the plating system of the related art, however, all of the portions of the copper foil leads 102 to which current was supplied end up being gold plated. If portions other than those requiring it are gold plated in this way, the expensive gold is used wastefully and the problem arises of a higher cost of the plating process.

SUMMARY OF THE INVENTION

An object of the present invention is to provide a partial plating system able to gold plate only the inner leads of a TAB tape.

To achieve the above object, according to a first aspect of the present invention, there is provided a partial plating system provided with a mask having an opening formed to correspond to a plating region of a TAB tape and provided horizontally; an elevating means for lowering the TAB tape toward the mask; and a pressing means for pressing the TAB tape on to the mask; a plating solution being sprayed from below the opening toward the opening to plate the plating region.

According to a second aspect of the invention, there is provided a partial plating system of the first aspect of the invention wherein the mask is provided on its surface with guide pins for engagement with engagement holes of the TAB tape and is placed on a base member so as to be able to slide in a horizontal plane around a predetermined reference position.

According to a third aspect of the invention, there is provided a partial plating system of the second aspect of the invention wherein a biasing member is provided between the elevating means and the base member and wherein the elevating means is biased to move away from the base member.

According to a fourth aspect of the invention, there is provided a partial plating system of any one of the first to third aspects of the invention further provided with a feeding means for transporting the TAB tape in a longitudinal direction by exactly a predetermined length after the partial plating system plates a certain length of the TAB tape in one plating operation.

According to a fifth aspect of the invention, there is provided a partial plating system of any of the first to fourth aspects of the invention wherein the elevating means is provided with a guiding means for use when the TAB tape is being transported in the longitudinal direction.

Next, the mode of operation of the present invention will be explained.

According to the partial plating system of the present invention, provision is made of a mask having an opening formed corresponding to the plating region of the TAB tape and provided horizontally. The TAB tape is lowered by the elevating means toward the mask, then is pressed against the mask by the pressing means, so the tape is pressed against the mask in a state with its surface held in the horizontal plane.

In the state pressed against the mask in this way, the plating region of the TAB tape is exposed from the opening. If the plating solution is sprayed from below the opening toward the opening in this state, the exposed plating region will be plated. At this time, since the portions of the TAB tape other than the plating region are covered by the mask, those portions will not be plated. Therefore, by recycling, the gold or other precious metals in the plating solution will not be used wastefully and the cost of the plating process can be reduced.

Further, by placing the mask horizontally and holding the TAB tape in the horizontal plane, the TAB tape is plated to a uniform thickness. That is, if the TAB tape is held in the horizontal plane, the plating solution will not flow over the surface of the plating solution after being sprayed. The amount of the plating solution deposited will become uniform and the plating thickness will therefore become uniform.

Further, according to the partial plating system of another aspect of the invention, guide pins for engagement with engagement holes of the TAB tape are provided on the surface of the mask. In this case, the mask is placed on a base member so as to be able to slide in the horizontal plane around a predetermined reference position. According to this, by engagement of the guide pins with the engagement holes of the TAB tape, the opening of the mask and the plating region of the TAB tape will be aligned in position and plating of portions other than the plating regions can be prevented.

Further, by placing the mask so as to be able to slide in the horizontal plane, it is possible to reduce the magnitude of the force acting on the TAB tape when the guide pins enter the engagement holes of the TAB tape. Therefore, even if the length of the TAB tape being transported to the partial plating system is made somewhat longer than when the mask cannot slide, the magnitude of the force acting on the TAB tape will never become larger than the case where the mask cannot slide. Due to this, it is possible to increase the length of the TAB tape plated in a single plating operation compared with when the mask cannot slide.

The partial plating system of the present invention is also applicable to partial plating of a lead frame, in which the lead frame is aligned with a mask by engaging the guide pins with engagement holes of the lead frame so that only a selected portion such as a die pad or a head of inner lead is subjected to plating.

BRIEF DESCRIPTION OF THE DRAWINGS

These and other objects and features of the present invention will be more apparent from the following description given with reference to the accompanying drawings, wherein:

FIG. 2A and FIG. 2B are enlarged sectional views of a mask and a base member of a partial plating system according to an embodiment of the present invention;

FIG. 3 is a functional block diagram of a partial plating system according to an embodiment of the present invention;

DESCRIPTION OF THE PREFERRED EMBODIMENTS

Next, a partial plating system according to the present invention will be explained in detail with reference to the drawings.

Figure 1:
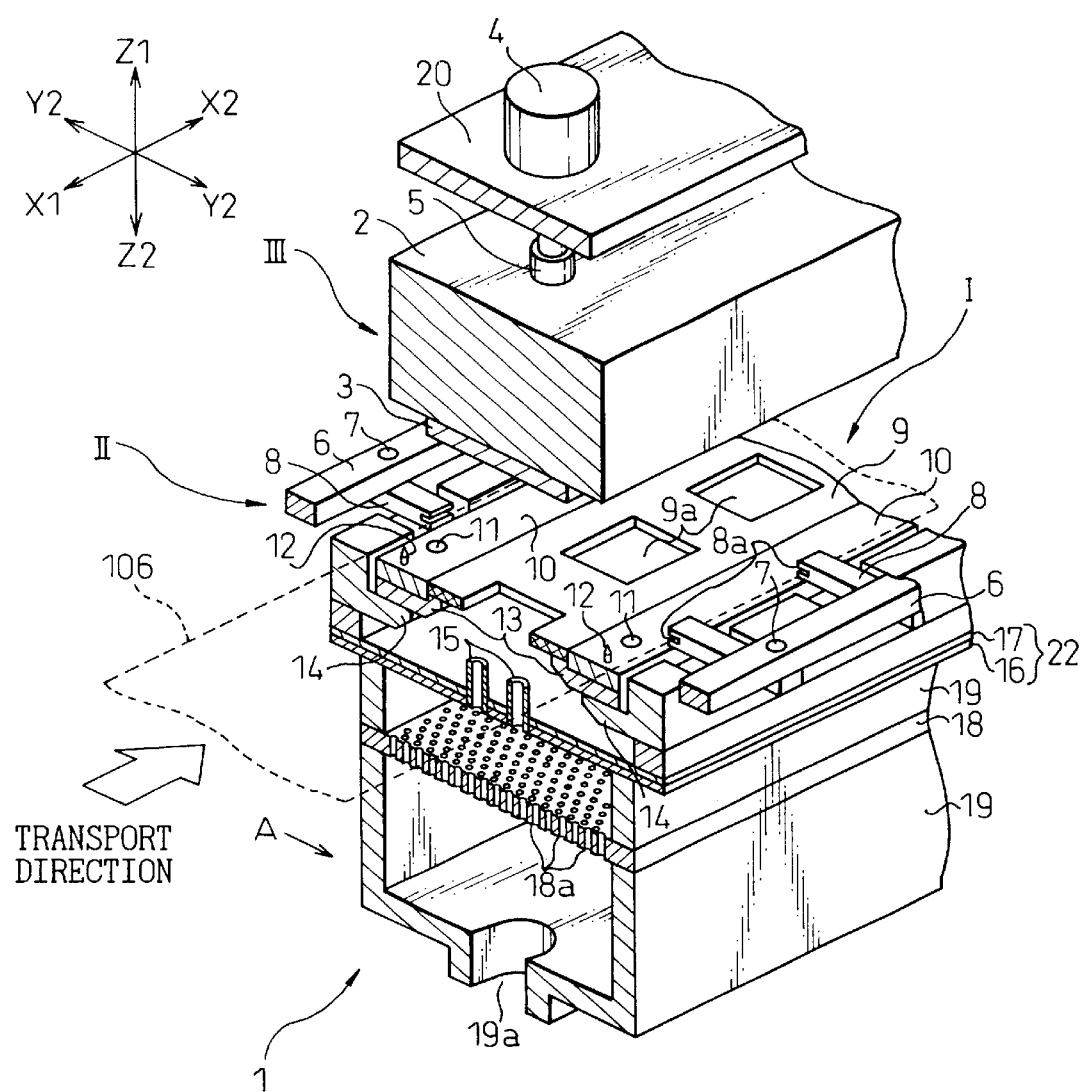
FIG. 1 is a partially cutaway view of the main parts of a partial plating system according to an embodiment of the present invention.

FIG. 1 is a partially cutaway perspective view of main parts of a partial plating system according to the present invention.

As shown in FIG. 1, the partial plating system 1 according to the present invention is comprised generally of a mask I, an elevator/guide unit II (elevating means), and a press unit III (pressing means). Further, the TAB tape 106 is transported to the partial plating system 1 in the state with its surface in a horizontal plane (called "horizontal transport" hereinafter). Note that the large arrow in the figure shows the direction of transport of the TAB tape 106. This matches with the longitudinal direction of the TAB tape 106.

The above mask I is provided with a mask jig 9 made of rubber or another elastomer. Further, this mask jig 9 is provided with a plurality of openings 9a, 9a . . . formed corresponding to plating regions of the TAB tape 106 and demarcating the plating regions. Here, the "plating regions" means regions of the TAB tape 106 (see FIG. 13A) which require gold plating. Specifically, they are the substantially rectangular regions including the inner leads 102a inside them. The shapes and sizes substantially match those of the device holes 104.

Cathode feed plates 10, 10 connected to a not shown power source are provided at the two sides of the mask jig 9. The cathode feed plates 10, 10 contact the copper foil leads 102 (see FIGS. 13A and 13B) to be plated on the TAB tape 106 and use the copper foil leads 102 as cathodes. Further, the cathode feed plates 10, 10 are provided with guide pins 12, 12 . . . for entering sprocket holes 103 (engagement holes) of the TAB tape 106 (see FIG. 13A). A plurality of the guide pins 12, 12 . . . are provided on the cathode feed plates 10, 10 at predetermined intervals in the transport direction (X1–X2 direction) so as correspond to the sprocket holes 103 (in FIG. 1, two of these are visible). The guide pins 12, 12 . . . function to position the plating regions of the TAB tape 106 and the openings 9a of the mask jig 9 with respect to each other by engagement with the sprocket holes 103.

Further, the mask jig 9 and the cathode feed plates 10, 10 are screwed to a holding plate 13. The holding plate 13 and the mask jig 9 and cathode feed plates 10, 10 constitute the mask I. The mask I is placed on a base member 14 so as to be able to slide around a predetermined reference position in the horizontal plane (X1–Y1 plane). This point will be explained with reference to FIG. 2A and FIG. 2B.

FIG. 2A and FIG. 2B are enlarged sectional views of the mask I and the base member 14 seen from the transport direction. As shown in FIG. 2A and FIG. 2B, the cathode feed plates 10 and the holding plate 13 are formed with through holes 21. Further, a threaded hole 14a communicating with the through holes 21 is provided in the base member 14 below the through holes 21. A mask fastening bolt 11 is passed through the through holes 21, then the threaded part of the mask fastening bolt 11 is screwed into the threaded hole 14a. Note that a plurality of mask fastening bolts 11 are provided at predetermined intervals in the transport direction.

The diameter of the head of the mask fastening bolt 11 is larger than the diameter D2 of the through holes 21. Due to this, the movement of the mask I in the vertical direction is limited. On the other hand, the diameter D1 of the threaded part of the mask fastening bolt 11 is smaller than the diameter D2 of the through holes 21, so a clearance is formed between the circumference of the mask fastening bolt 11 and the through holes 21. Therefore, the mask I can freely move in the horizontal direction by exactly that clearance. In other words, the mask I is placed on the base member 14 so as to be able to slide around the position of the mask fastening bolts 11 (reference positions).

Referring again to FIG. 1, an anodic nozzle plate 22 comprised of a protective plate 16 and an anodic plate 17 are provided below the mask I. In the present embodiment, a polyvinyl chloride plate is used as the protective plate 16. Further, a stainless steel plate is used as the anodic plate 17. Among these, the anodic plate 17 functions as the anode at the time of electroplating. Further, the protective plate 16 functions to prevent the plating solution rising from below from directly contacting the anodic plate 17 and corroding the anodic cathode plate 17.

Further, nozzles 15, 15 . . . are provided on the anodic nozzle plate 22 at positions corresponding to the openings 9a of the mask jig 9. The plating solution rises through these nozzles 15, 15 . . . and is sprayed from the front ends to the plating surfaces of the TAB tape 106. At this time, the plating solution may be sprayed to only the portions of the TAB tape exposed from the openings 9a, so the nozzles 15, 15 . . . may be arranged in accordance with the size and shape of the openings 9a. In the present embodiment, four nozzles 15, 15 . . . are provided for one opening 9a (in FIG. 1, only two of the four are visible). Further, as the nozzles 15, 15 . . . , for example polyvinyl chloride pipes may be used.

Below the above anodic nozzle plate 22 is provided an orifice plate 18 formed with a plurality of orifices 18a, 18a . . . These orifices 18a, 18a, . . . function to make the flow of the plating solution rising from below uniform to make the spraying of the plating solution from the nozzles 15 uniform. Due to this, it is possible to plate the TAB tape 106 to obtain a uniform plating thickness.

Note that the orifice plate 18 is housed in a sparger tank 19. At the bottom of the sparger tank 19 is formed a plating solution feed port 19a for supplying plating solution to the inside.

Above the mask I is arranged an elevator/guide unit II comprised of a plurality of support pieces 8, 8 . . . and connecting rods 6, 6 for connecting these by screws 7, 7 . . . Here, the front ends of the support pieces 8, 8 . . . are provided with guide grooves 8a for receiving the peripheral edges of the TAB tape 106 and guiding the TAB tape in the transport direction. Note that a plurality of support pieces 8, 8 . . . are arranged at predetermined intervals in the transport direction.

The elevator/guide unit II is connected to an actuator (not shown) driven to elevate and descend in the vertical direction and can therefore be elevated or lowered in the vertical direction. Further, the TAB tape 106 is also made to elevate and lower in the vertical direction along with the motion of the elevator/guide unit II.

Above the elevator/guide unit II is arranged a press unit III comprised of a press block 2 and a backing 3. Above this is further arranged an upper chassis 20 and actuator 4 provided at the same. Note that the upper chassis 20 is fastened to a not shown housing of the partial plating system 1.

The actuator 4 is connected to one end of an elevation shaft 5. The other end of the elevation shaft 5 is connected to the press block 2. The actuator 4 drives the elevation shaft 5 to rise or descend in the vertical direction and thereby drive the press unit III to rise or descend in the vertical direction.

The backing 3 functions to press the back of the TAB tape 106 (side opposite to plating surface) so that the plating surface of the TAB tape 106 is pressed against the mask jig 9 when the press unit III is lowered (Z2 direction). If the mask jig 9 is pressed against so that no clearance is formed between the plating surface of the TAB tape 106 and the mask jig 9, it will be possible to prevent entry of the plating solution to portions of the TAB tape 106 other than the plating regions. In particular, if an elastomer is used as the backing 3, the TAB tape 106 can be pressed against the mask jig 9 as desired. In the present embodiment, the backing 3 is made of silicone rubber or another rubber, a sponge, etc.

The above elevator/guide unit II and press unit III are controlled in motion by a controller 23 shown in FIG. 3. FIG. 3 is a functional block diagram of the partial plating system 1 according to the present embodiment. The controller 23 shown in FIG. 3 controls the actuator 4 or the actuator for driving the vertical motion of the elevator/guide unit II (not shown) and thereby controls the movement of the elevator/guide unit II and the press unit III.

Further, the TAB tape 106 is fed into the partial plating system 1 by a tape feeder 24 (feeding means) shown in FIG. 3. Specifically, the tape feeder 24 is controlled by the controller 23 to feed exactly a certain length of the TAB tape 106 in the transport direction. When that length finishes being plated, a new same length of the TAB tape 106 is fed to the partial plating system 1. In other words, the tape feeder 24 intermittently feeds the TAB tape 106, and that length of the TAB tape 106 is plated by a single plating operation.

Figure 4:
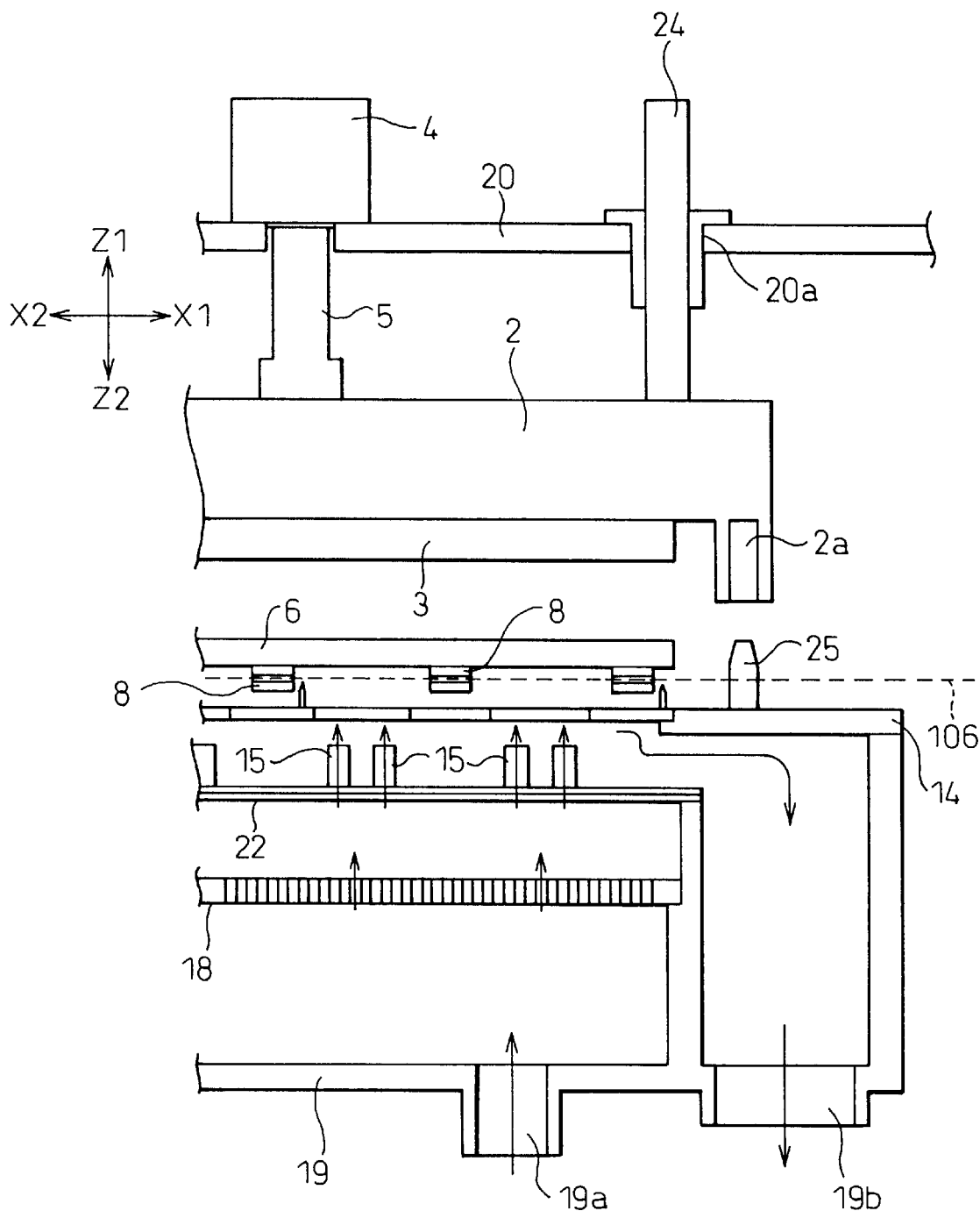
FIG. 4 is a sectional view of a partial plating system according to an embodiment of the present invention as seen from the side A of FIG. 1.

Next, an explanation will be given, while referring to FIG. 4, of the partial plating system according to the present invention. FIG. 4 is a sectional view of the partial plating system 1 viewed from the side A of FIG. 1.

As shown in FIG. 4, a guide shaft 24 is fixed to the press block 2. This guide shaft 24 is inserted through a guide hole 20a of the upper chassis 20. This guide shaft 24 guides the upward and downward movement of the press block so that the press block does not tilt.

Further, the rear end of the press block 2 is formed with a positioning hole 2a in which a backing positioning pin 25 provided at the base member 14 can enter. When the press unit III is lowered downward (Z2 direction), the backing positioning pin 25 enters the positioning hole 2a, whereby the backing 3 is guided to the predetermined position.

The solid arrows in FIG. 4 show the flow of the plating solution. The plating solution is first pumped from the plating solution feed port 19a to the inside of the sparger tank 19. Next, it is pumped up by a not shown pump, passes through the orifice plate 18, and is sprayed from the front ends of the nozzles 15. The sprayed plating solution proceeds next toward the right in the figure (X1 direction) and finally is discharged to the outside from the plating solution discharge port 19. Next, the plating solution discharged to the outside is again transported to the plating solution pumping port 19*a* by a not shown pump and supplied into the partial plating system 1 again from there.

Next, the operation of the partial plating system 1 for performing the partial plating will be explained with reference to FIG. 5 to FIG. 11. FIG. 5 to FIG. 10 are sectional views of the partial plating system 1 performing the plating as seen from the transport direction. Note that in these figures, members which do not have to be explained below are omitted. Further, FIG. 11 is a flow chart of the plating operation of the partial plating system 1.

Figure 5:
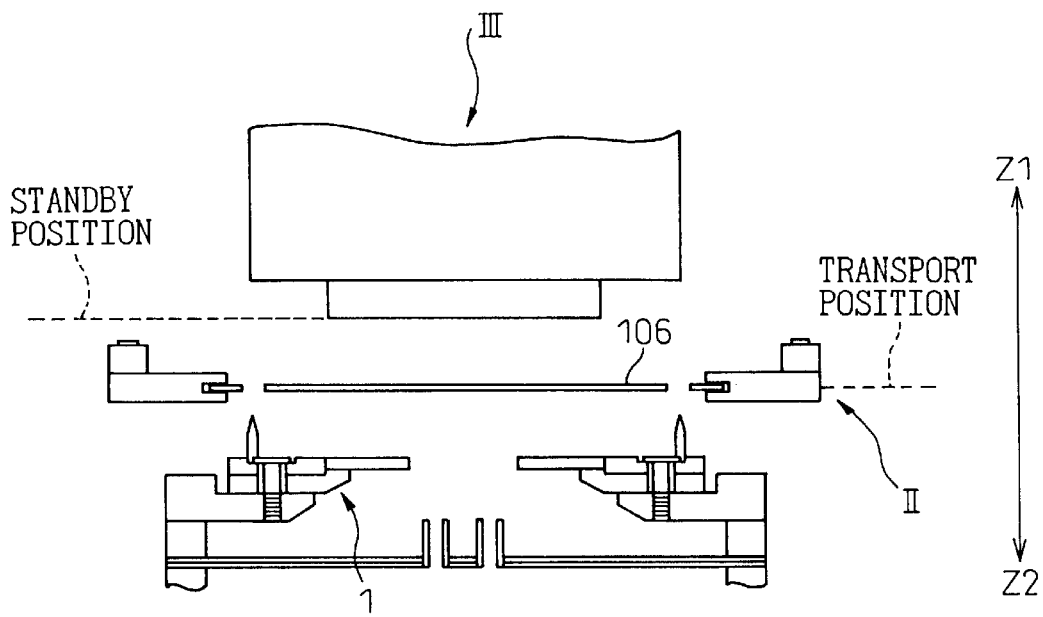
FIG. 5 to FIG. 10 show steps in the process of partial plating by a partial plating system according to an embodiment of the present invention.

First, before the plating, the entire system is in the state shown in FIG. 5. In this state, the press unit III is highest in position. Below, this height position of the press unit III will be called the "standby position". On the other hand, the elevator/guide unit II is at the height position where the TAB tape 106 is transported toward the transport direction. At this height position, the TAB tape 106 can move freely in the transport direction without interference with the mask I or the press unit III. Below, this height position of the elevator/guide unit II will be called the "transport position".

Figure 6:
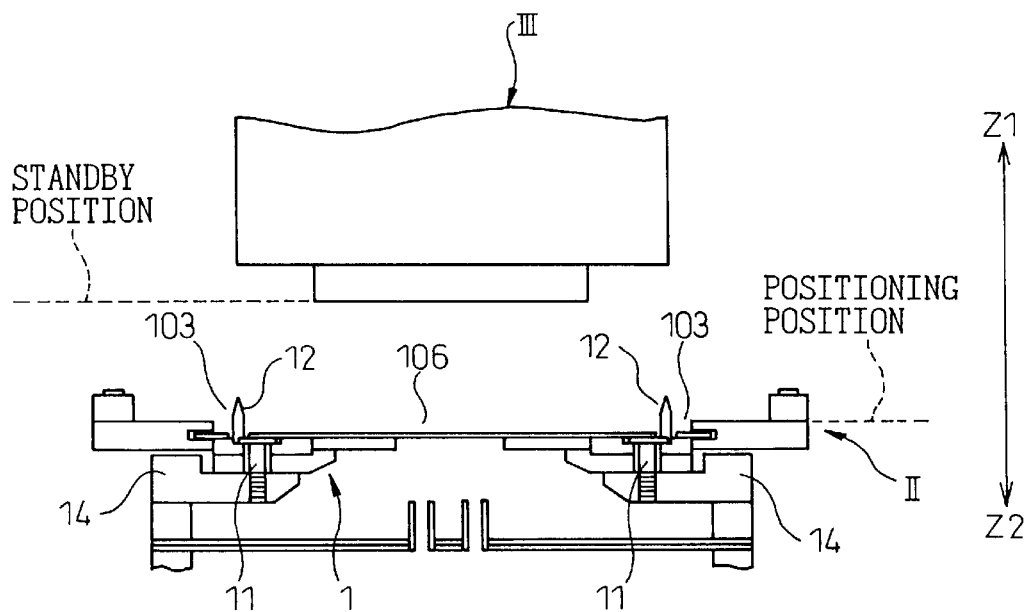

Next, as shown in FIG. 6, the elevator/guide unit II is lowered downward (Z2 direction) (step S1). Due to this, the TAB tape 106 is lowered downward and the guide pins 12 enter the sprocket holes 103 (see FIG. 13A). At this time, the guide pins 12 contact the inside walls of the sprocket holes 103 and the TAB tape 106 and the mask jig 9 are corrected in position so that the plating regions of the TAB tape 106 come into register with the openings 9*a* of the mask jig 9. In other words, in the step shown in FIG. 6, the plating regions of the TAB tape 106 and the openings 9*a* of the mask jig 9 are positioned with respect to each other. The height position of the elevator/guide unit II at this time will be called the "positioning position" below.

Due to this step, in the later steps, it is possible to prevent portions other than the plating regions from being plated or the plating regions from not being plated as desired.

Further, as explained previously, the mask I is placed on the base member 14 so as to be able to slide around the positions of the mask fastening bolts 11 (reference positions). Therefore, in this process, the positions of not only the TAB tape 106, but also the mask I are corrected so that the plating regions and the openings come into register.

The present inventor discovered that by enabling the mask I to slide in this way, the length of the TAB tape 106 plated in a single plating operation can be increased over the case where the mask I cannot slide. This will be explained below.

First, when the mask I cannot slide, when the guide pins 12 contact the inside walls of the sprocket holes 103, the force acting between them is released by the TAB tape 106 shifting in position in the horizontal plane (X1–Y1 plane).

On the other hand, when the mask I can slide, when the guide pins 12 contact the inside walls of the sprocket holes 103, the force acting between them is released by the TAB tape 106 and the mask I shifting in position in the horizontal plane. The force acting on the TAB tape 106 becomes smaller than the case where the mask I cannot slide due to the mask I shifting in the horizontal plane. Therefore, in this case, the force acting on a unit length of the TAB tape 106 becomes smaller than the case where the mask I cannot slide.

Further, in both of the above cases, the force acting on the TAB tape 106 becomes larger the longer the length of the TAB tape 106 transported to the partial plating system (length plated by a single plating operation). The force acting on the TAB tape 106, however, is preferably kept as small as possible to prevent deformation of the TAB tape 106.

Further, by the designing the system as explained above so that the mask I can slide as in the present embodiment, the force acting on the TAB tape 106 can be kept small even if increasing the length of the TAB tape 106 being plated by a single plating operation. That is, in the present embodiment, the length of the TAB tape plated by a single plating operation can be increased compared with the case where the mask I cannot slide.

According to experiments performed by the present inventor, if the mask I is able to slide, the length of the TAB tape which can be plated by a single plating operation becomes about twice that of the case where the mask I cannot slide. Due to this, the throughput of the partial plating system 1 can be improved over the case where the mask I cannot slide.

Here, to obtain this action and effect, it is necessary to ensure that the TAB tape 106 be transported horizontally to the partial plating system 1 and that the mask I be placed horizontally. This is because if the TAB tape 106 is transported vertically as in the related art, the mask I also has to be made vertical to match with it. If this is done, the mask I and the TAB tape 106 cannot be positioned as desired due to the inherent weight of the mask I.

Figure 7:
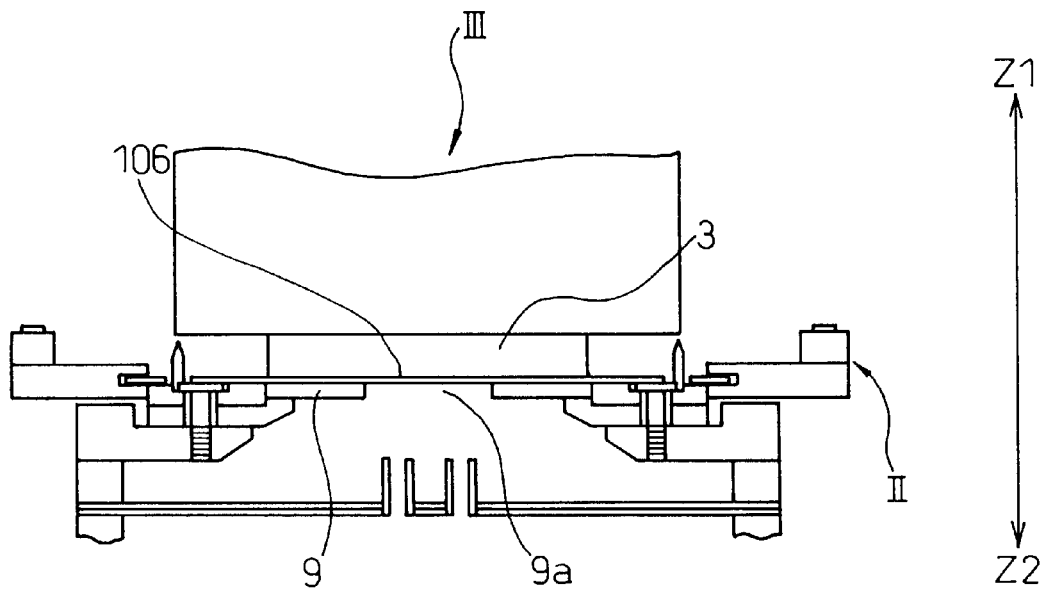

After the plating regions of the TAB tape 106 and the openings 9*a* of the mask jig 9 are positioned in this way, the process shown in FIG. 7 (step S2) is performed. In this process, the press unit III in the standby position is lowered to press against the back of the TAB tape 106 by the backing 3. Below, this height position of the press unit III will be called the "pressing position".

In this process, the TAB tape 106 and the mask jig 9 positioned at step S1 are pressed together and the plating regions of the TAB tape 106 are demarcated by the openings 9*a* of the mask jig 9.

Figure 8:
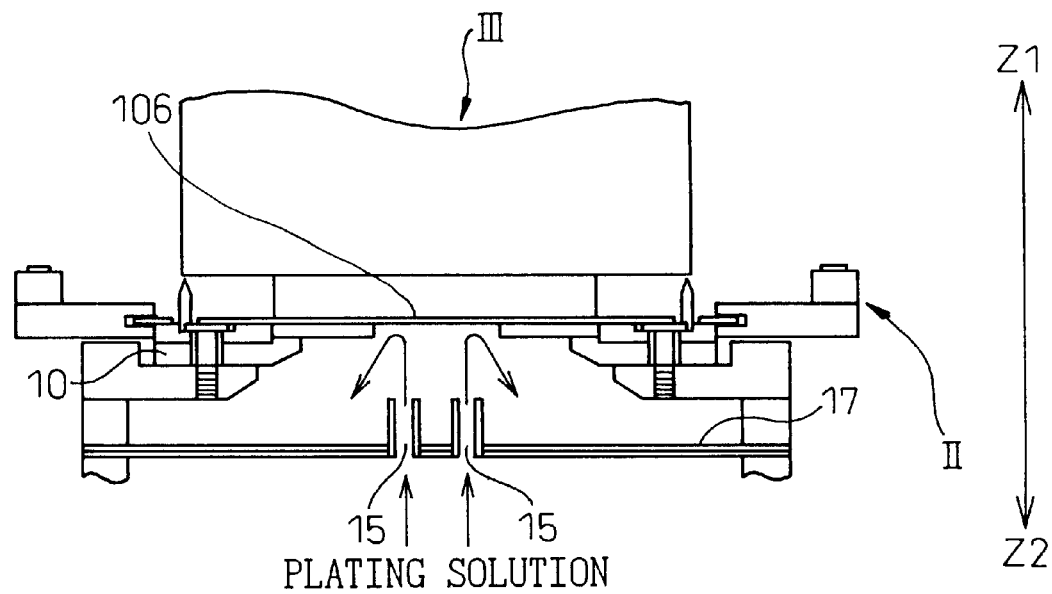

Next, as shown in FIG. 8, the plating solution is pumped up and sprayed from the nozzles 15 (step S3). Due to this, the plating solution is sprayed at the plating regions of the TAB tape 106 exposed from the openings 9*a* of the mask jig 9 and the plating regions are gold plated. At this time, portions of the TAB tape 106 other than the plating regions are covered by the mask jig 9, so the portions other than the plating regions will not be plated unlike in the past. Therefore, with recycling, there is no wasteful use of expensive gold and the cost of the plating process can be reduced.

Further, by arranging the TAB tape 106 in the horizontal plane and facing the plating regions downward, the plating solution will not flow over the surface of the plating regions after being sprayed, the amount of the plating solution deposited will become uniform in the plating regions, and therefore the plating thickness can be made uniform.

Figure 9:
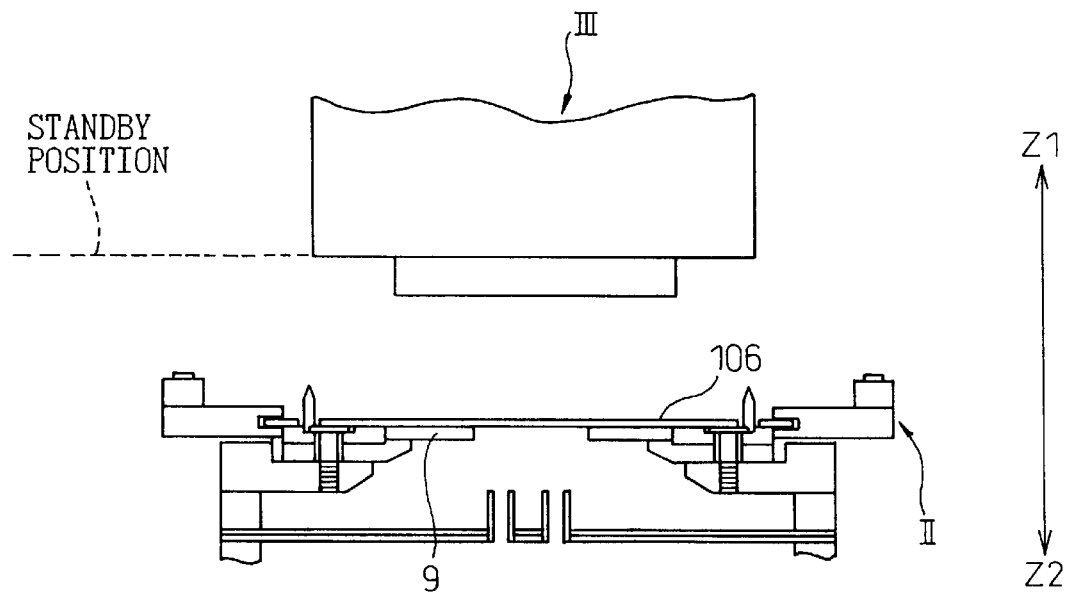

Next, as shown in FIG. 9, the pumping of the plating solution is stopped, then the press unit III is made to rise to stand by at that height position (step S4). At this time, the TAB tape 106 and the mask jig 9 are in close contact due to the surface tension of the plating solution remaining between them.

Figure 10:
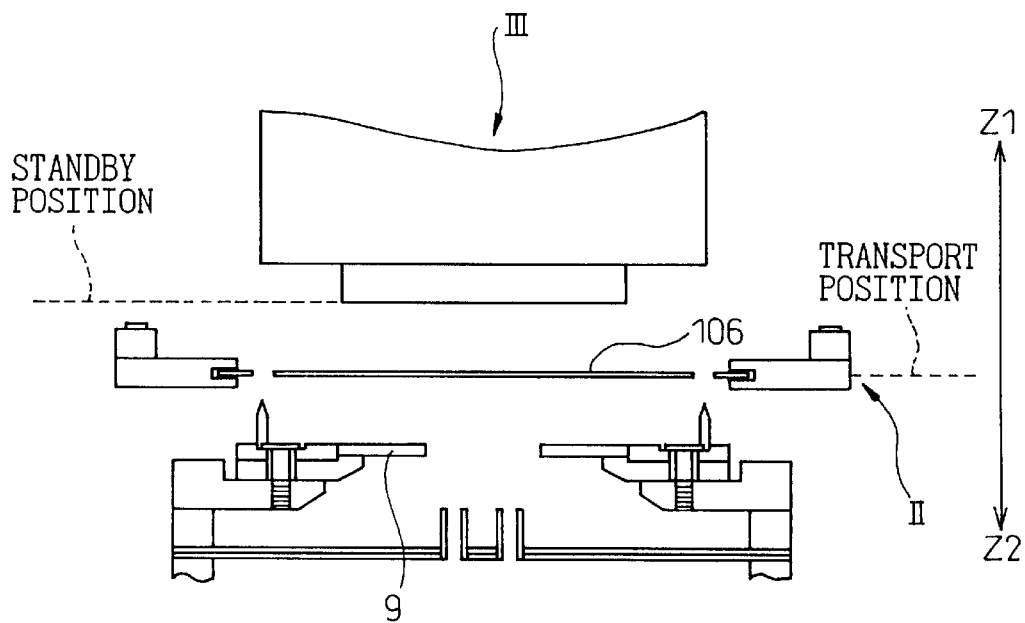
Figure 11:
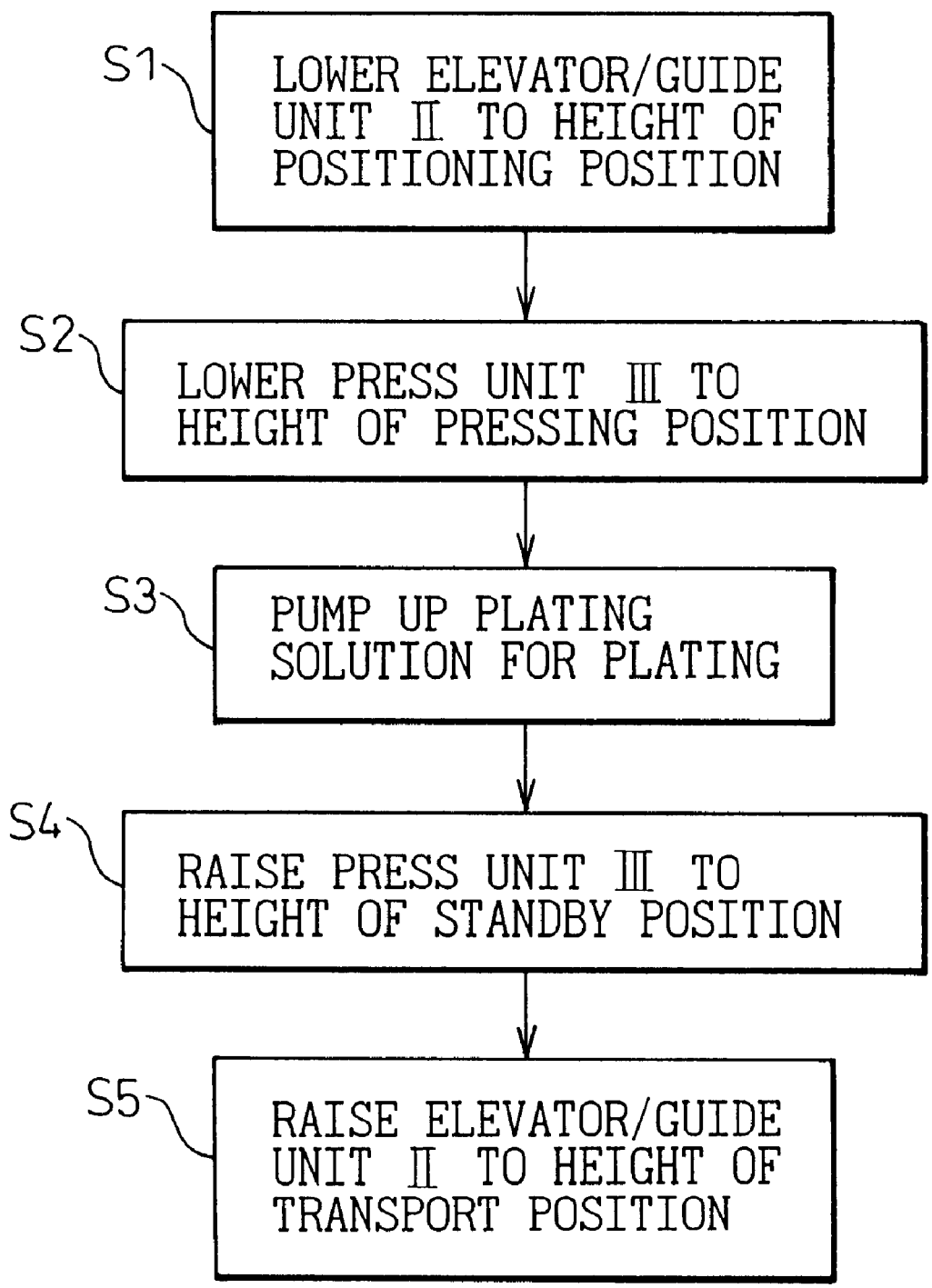
FIG. 11 is a flow chart of the process of partial plating by a partial plating system according to an embodiment of the present invention.

Next, as shown in FIG. 10, the elevator/guide unit II is made to rise to the height of the transport position (step S5). Due to this, the closely contacting TAB tape 106 and mask jig 9 are separated. Next, the steps shown in FIG. 5 to FIG. 10 are repeated.

In the above, the elevator/guide unit II is driven to rise and descend by a not shown actuator, but the present embodiment is not limited to this. For example, similar actions and effects as the above are exhibited even when using an elevator/guide unit II shown in FIG. 12. In the partial plating system 1 shown in FIG. 12, springs 26 (biasing members) are provided between the base member 14 and the elevator/guide unit II. Further, these springs 26 bias the elevator/guide unit II in the direction to move away from the base member. Note that when using such an elevator/guide unit II, projections 2b are provided at the press block 2.

Figure 12:
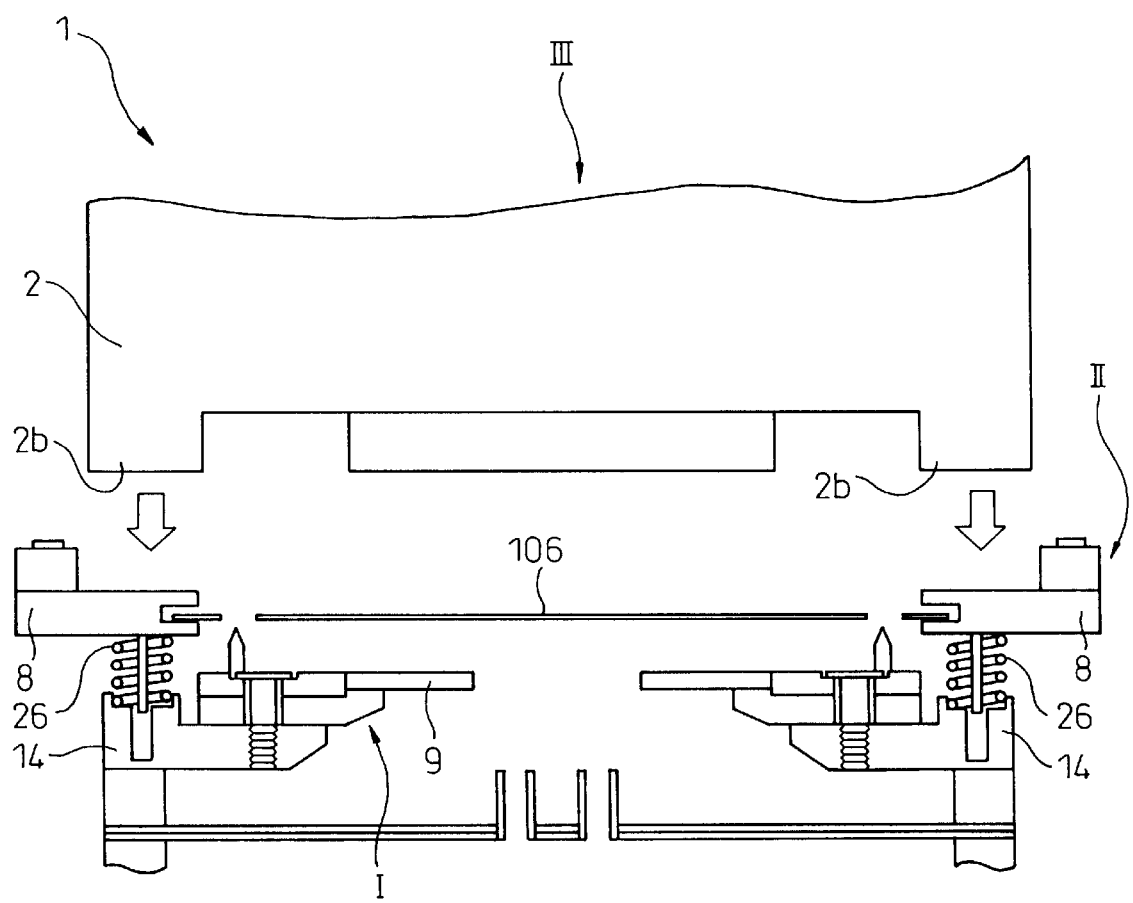
FIG. 12 is a sectional view of a base member and an elevator/guide unit in a partial plating system according to an embodiment of the present invention when biasing the base member and the elevator/guide unit by springs.

In the elevator/guide unit II, when lowering the press unit III downward, the projections 2b abut against the support pieces 8 whereby the support pieces 8 are pressed downward. Therefore, no actuator is needed for driving the elevator/guide unit II to rise or descend. Therefore, the cost of production of the partial plating system 1 can be reduced by the amount of that actuator. Further, along with this, it is possible to simultaneously perform the step shown in FIG. 9 and the step shown in FIG. 10. That is, if the press unit III is made to rise as shown in FIG. 9, the elevator/guide unit II is made to naturally rise to the transport position by the elastic force of the springs 26 and the TAB tape 106 and mask jig 9 are separated. Due to this, if the elevator/guide unit II shown in FIG. 12 is used, it is possible to simplify the plating process.

Figure 13A:
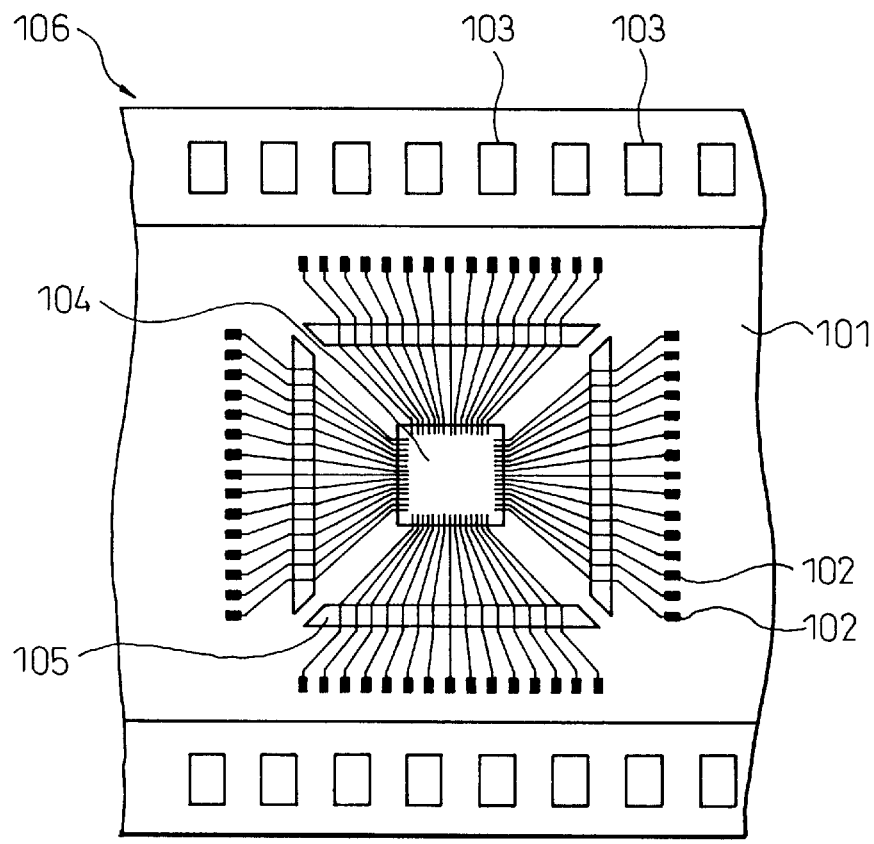
FIG. 13A and FIG. 13B are a plan view and a partially enlarged plane view of a TAB tape.
Figure 13B:
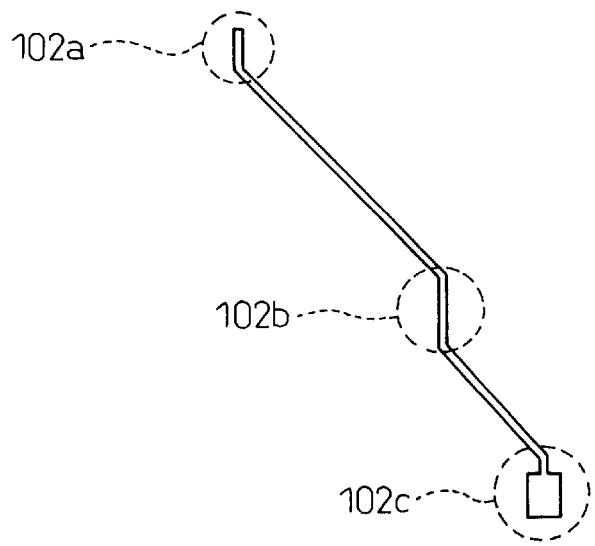
Figure 14:
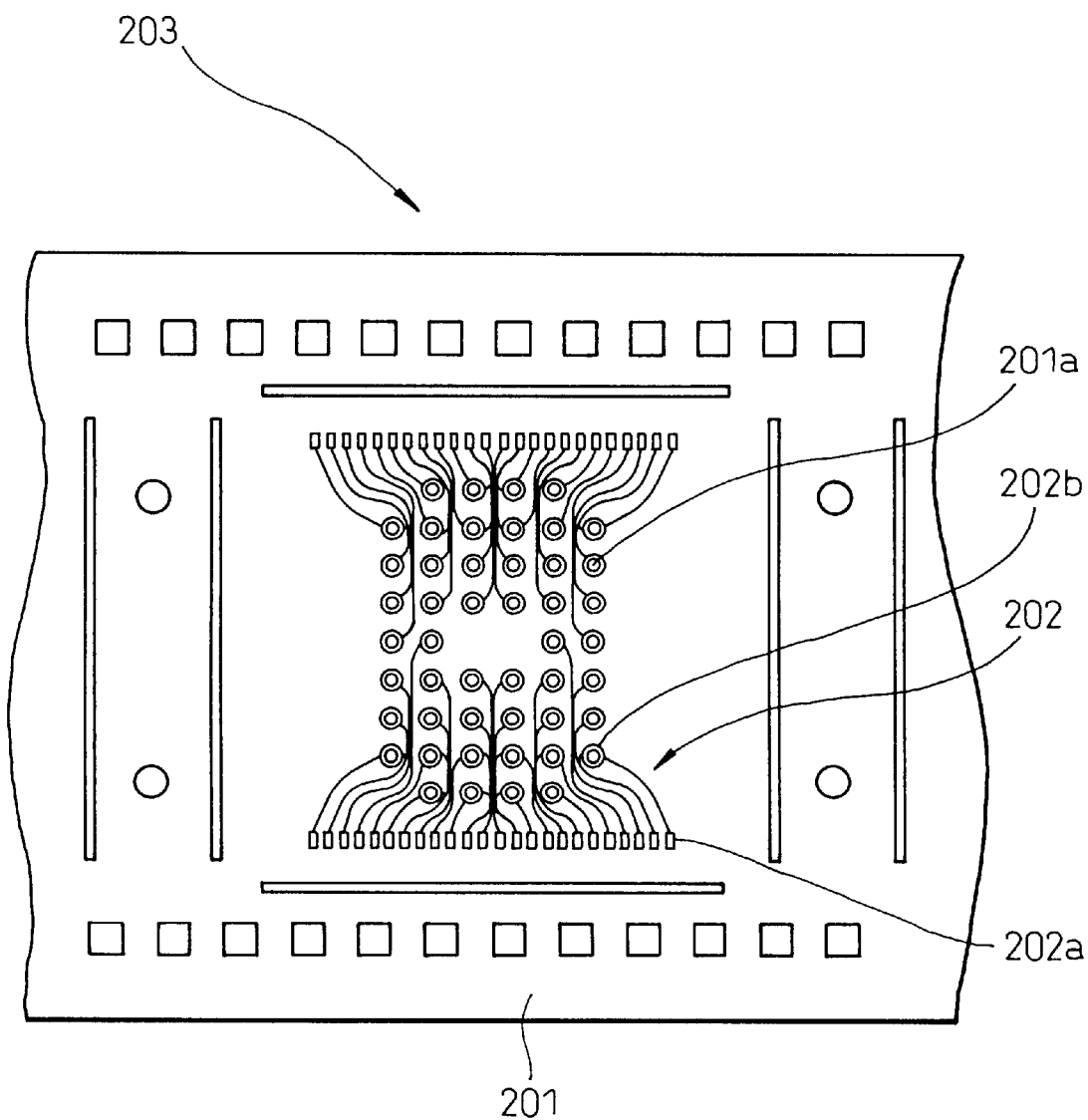
FIG. 14 is a plane view of a tape for a tape BGA.
Figure 15:
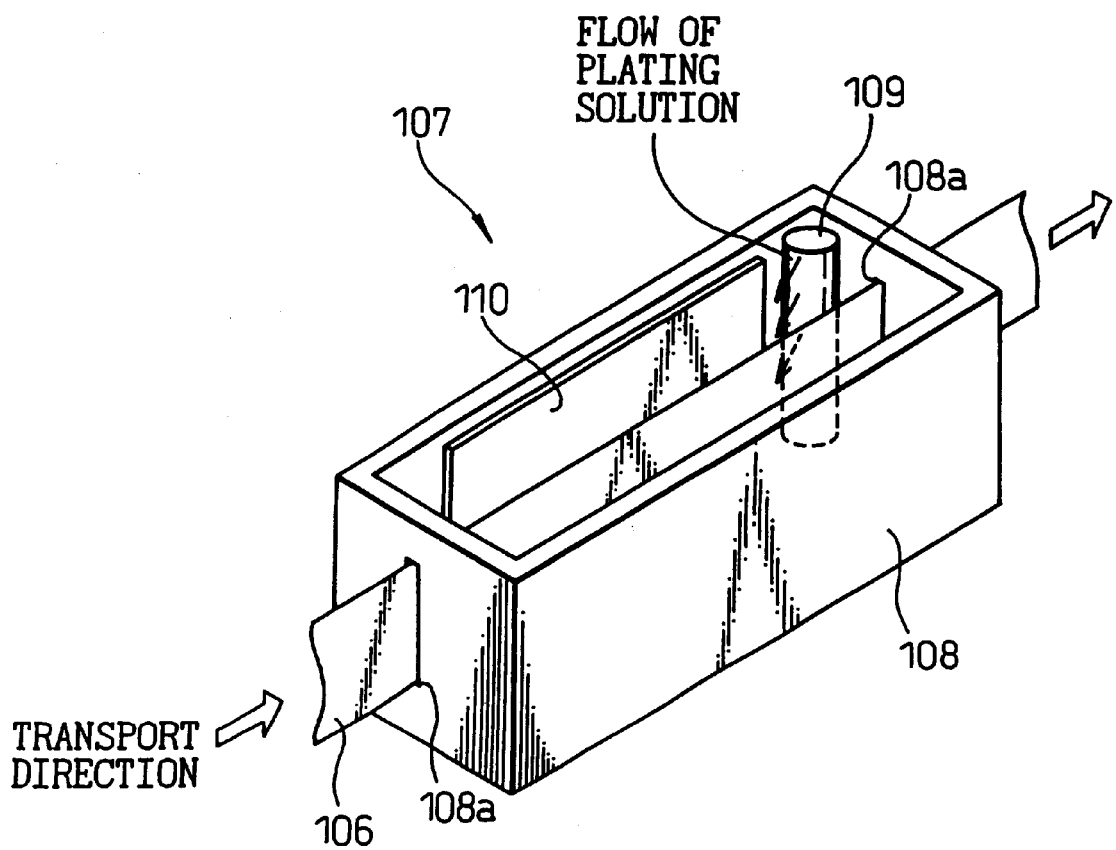
FIG. 15 is a perspective view of an overall plating system of the related art.

Note that the TAB tape of the present embodiment includes a tape 203 for a tape ball grid array (BGA) as shown in FIG. 14 in addition to the TAB tape 106 shown in FIG. 13A.

In a tape BGA, a copper foil bonded to a polyimide film 201 is patterned to form a wiring pattern 202. The polyimide film 201 is formed with through holes 201a, 201a . . . Pads 202b, 202b, . . . of the wiring pattern are formed at the open ends of the through holes 201a, 201a, . . . The pads 202b, 202b, . . . are connected to solder bumps for forming the external connection terminals through the through holes 201a, 201a, . . . .

The mounted semiconductor element (not shown) is then wire bonded by the wire bonding parts 202a, 202a, . . . of the wiring pattern 202 and the gold wires. Then, the partial plating system 1 of the present embodiment is used to partially plate the wire bonding parts 202a, 202a . . . with gold.

Summarizing the effects of the invention, as explained above, according to the partial plating system of the present invention, by demarcating the plating regions of the TAB tape by the mask, portions of the TAB tape other than the plating regions will not be plated. Therefore, with recycling, there is no wasteful use of gold or other expensive precious metals in the plating solution and the cost of the plating process can be reduced.

Further, by plating the TAB tape in the horizontal state, it is possible to suppress variations in the plating thickness in the plating regions.

Further, by providing guide pins on the surface of the mask for engagement with engagement holes of the TAB tape, it is possible to position the plating regions of the TAB tape and the openings of the mask with respect to each other and prevent plating of portions other than the plating regions.

Further, in this case, by placing the mask on a base member so as to be able to slide in a horizontal plane around a predetermined reference position, it is possible to ease the force acting on the TAB tape at the time of positioning. Due to this, it is possible to increase the length of the TAB tape plated by a single plating operation compared with the case where the mask cannot slide.

While the invention has been described with reference to specific embodiment chosen for purpose of illustration, it should be apparent that numerous modifications could be made thereto by those skilled in the art without departing from the basic concept and scope of the invention.

What is claimed is:

1. A partial plating system comprising:

a mask having an opening formed to correspond to a plating region of a TAB tape and provided horizontally;

an elevating means for lowering said TAB tape toward said mask before start of plating and for raising said TAB tape away from said mask after completion of plating, said elevating means being provided with a plurality of guide means for use when said TAB tape is being transported in a longitudinal direction, said plurality of guide means being provided with guide grooves for receiving peripheral edges of the TAB tape in a transport direction; and a pressing means for pressing the TAB tape on to said mask;

a plating solution being sprayed from below said opening toward said opening to plate said plating region.

2. A partial plating system as set forth in claim 1, wherein said mask is provided on its surface with guide pins for engagement with engagement holes of said TAB tape and is placed on a base member so as to be able to slide in a horizontal plane around a predetermined reference position.

3. A partial plating system as set forth in claim 2, wherein a biasing member is provided between said elevating means and said base member and wherein said elevating means is biased to move away from said base member.

4. A partial plating system as set forth in any one of claims 1 to 3, further provided with a feed means for transporting said TAB tape in said longitudinal direction by exactly a predetermined length after the partial plating system plates a certain length of the TAB tape in one plating operation.

5. A partial plating system as set forth in any one of claims 1 to 3, wherein said TAB tape is replaced with a lead frame.

* * * * *